United States Patent
Whitfield

(10) Patent No.: US 7,074,687 B2
(45) Date of Patent: Jul. 11, 2006

(54) METHOD FOR FORMING AN ESD PROTECTION DEVICE

(75) Inventor: James D. Whitfield, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 1 day.

(21) Appl. No.: 10/407,687

(22) Filed: Apr. 4, 2003

(65) Prior Publication Data
US 2004/0195630 A1    Oct. 7, 2004

(51) Int. Cl.
H01L 21/336    (2006.01)
H01L 21/331    (2006.01)

(52) U.S. Cl. .............. 438/372; 438/282; 257/355; 257/357

(58) Field of Classification Search .......... 438/140, 438/200, 305, 306, 372, 380, 519, 521, 527, 438/529, 983, 282; 257/173, 355, 358, 360, 257/356, 357; 357/356, 357
See application file for complete search history.

(56) References Cited

U.S. PATENT DOCUMENTS

| | | | |
|---|---|---|---|
| 5,341,005 A | | 8/1994 | Canclini |
| 5,623,387 A | | 4/1997 | Li et al. |
| 5,825,072 A | | 10/1998 | Yen et al. |
| 5,850,095 A | | 12/1998 | Chen et al. |
| 5,898,205 A | | 4/1999 | Lee |
| 5,946,177 A | | 8/1999 | Miller et al. |
| 5,959,332 A | * | 9/1999 | Ravanelli et al. ........... 257/360 |
| 5,982,217 A | | 11/1999 | Chen et al. |
| 6,125,021 A | | 9/2000 | Duvvury et al. |
| 6,130,117 A | * | 10/2000 | Walker et al. ............... 438/133 |
| 6,140,683 A | | 10/2000 | Duvvury et al. |
| 6,218,226 B1 | | 4/2001 | Lin et al. |
| 6,249,410 B1 | | 6/2001 | Ker et al. |
| 6,249,413 B1 | | 6/2001 | Duvvury |
| 6,310,379 B1 | | 10/2001 | Andresen et al. |
| 6,327,126 B1 | | 12/2001 | Miller et al. |
| 6,348,724 B1 | | 2/2002 | Koomen et al. |
| 6,385,021 B1 | | 5/2002 | Takeda et al. |
| 6,424,013 B1 | | 7/2002 | Steinhoff et al. |
| 6,472,286 B1 | | 10/2002 | Yu |
| 6,586,818 B1 | * | 7/2003 | Voldman ..................... 257/587 |
| 6,724,603 B1 | | 4/2004 | Miller et al. |
| 6,879,476 B1 | | 4/2005 | Khazhinsky et al. |

OTHER PUBLICATIONS

Chen et al., "Design and Layout of a High ESD Performance NPN Structure for Submicron BiCMOS/Bipolar Circuits," IEEE, 1996, pp. 227-232.

(Continued)

Primary Examiner—Zandra V. Smith
Assistant Examiner—Pamela E Perkins
(74) Attorney, Agent, or Firm—Patricia S. Goddard

(57) ABSTRACT

An ESD protection device (20) comprises an N-type epitaxial collector (21), a first, lightly doped, deep base region (221) and second, highly doped, shallow base region (222) that extends a predetermined lateral dimension. The device responds to an ESD event by effecting vertical breakdown between the base regions and the N-type epitaxial collector. The ESD response is controlled by the predetermined lateral dimension, S, which, in one embodiment, may be is determined by a single masking step. Consequently, operation of the ESD protection device is rendered relatively insensitive to the tolerances of a fabrication process, and to variations between processes.

12 Claims, 3 Drawing Sheets

OTHER PUBLICATIONS

Coffing, Danielle et al.; Analysis of a Zener-Triggered Bipolar ESDP Structure in a BiCMOS Technology; IEEE BCTM; Sep. 1998; IEEE BCTM 1.2; USA.

U.S. Appl. No. 10/914,442 entitled "ESD Protection for an Integrated Circuit".

U.S. Appl. No. 10/315,796 entitled "Transient Detection Circuit".

* cited by examiner

METHOD FOR FORMING AN ESD PROTECTION DEVICE

BACKGROUND OF THE INVENTION

1. Field of the Invention

The invention relates generally to the design and fabrication of semiconductor devices and, more particularly, to the design and fabrication of an integrated circuit (IC) device that comprises electrostatic discharge (ESD) protection in the form of an integral bipolar junction transistor (BJT).

2. Related Art

As semiconductor device technology continues the seemingly ineluctable evolution into and beyond the realm of submicron feature sizes, a number of aspects of device operation have assumed substantially increased significance. For example, advanced complementary metal oxide semiconductor (CMOS) devices, in which thin gate oxides and low drain/substrate breakdown voltages now prevail, are especially vulnerable to ESD events. ESD commonly occurs when an IC device comes in contact with or in proximity to an object that is charged to an electrostatic potential that differs substantially from the electrostatic potential of the device in question. During an ESD event, charge is transferred within a short period of time between one or more pins on an IC package and the exogenous charged object. Typically, the duration of an ESD pulse is less than one microsecond. The charge transfer is accompanied by a transient voltage and/or current that is often adequate to break down or at least damage the gate oxide layer of active MOS devices internal to the IC. The ESD transient may also precipitate electro-thermal failures, such as contact spiking, silicon melting or interconnect discontinuities. Consequently, IC products judiciously include internal ESD protection circuits as a prophylaxis against ESD events that result from contact with human beings, machine handling in fabrication, assembly and testing, and environmental conditions. (Operation of semiconductor devices in an automotive environment is recognized to be especially hostile from an ESD perspective.)

The magnitude of ESD phenomena as a threat to semiconductor device reliability is reflected in the attention attracted in the technical literature. See, for example, Ajith Amerasekera and Charvaka Duvuury, ESD in *Silicon Integrated Circuits* ($2^{nd}$ Ed.), John Wiley & Sons (2002); Albert H. Wang, *On-Chip ESD Protection for Integrated Circuits: An IC Design Perspective*, Kluwer Academic Publishers (2002).

Perhaps the most common protection scheme encountered in CMOS ICs is based on the parasitic BJT that is associated with an nMOS transistor. Consonant with this approach, the drain of the associated pMOS transistor is connected to an IC pin that is to be protected, and the associated nMOS source is coupled to GND. (In this context, GND may be understood to be any reference node that serves as a current sink, regardless whether the voltage potential of the node is 0V.) The ESD protection threshold is dependent on the width of the nMOS transistor from drain to source under the gate oxide. When an ESD event occurs, operation of the parasitic BJT is driven into its snapback region, and the BJT conducts current from the protected pin to GND, thereby diverting the ESD energy away from other devices internal to the IC. An ESD protection device predicated on the above configuration is depicted in FIG. 1.

As may be seen in FIG. 1, relevant portions of a conventional ESD protection device that may be incorporated into an IC product include an N-type epitaxial layer 11 that has been formed on a substrate (not shown). A P-type base 12 is formed in epitaxial layer 11, as is a deep N-type collector region 13. A highly doped $P^+$ base extension 14 effectively defines the lateral (i.e., horizontal) spacing between the base and collector regions.

Processing techniques used to fabricate ESD protection device 10 are a matter of a priori knowledge to skilled practitioners and will not be discussed in detail here. Suffice it to say that various photolithographic, implantation and diffusion steps may be involved. However, it is important to appreciate that the formation of collector region 13 and base regions 12 and 14 require at least two distinct photolithographic patterning steps and, concomitantly, two distinct mask layers. As may be readily comprehended from FIG. 1, the spacing (indicated by the literal "S" in FIG. 1) between base regions (12,14) and collector region 13 is established indirectly, as a function of the base and collector region geometries. Therefore, variations in the registration or alignment of the base and collector masks, or variations in dimensions of those masks per se, are translated into variations in the spacing, S, between the base and collector regions. Because operation of ESD protection device 10 is predicated on the occurrence of breakdown between the base and collector regions as a result of an ESD event, the spacing dimension is a critical determinant of the ESD protection threshold.

To wit: an ESD event (assume here a positive-going voltage transient) causes the bias at collector region 13 to increase dramatically. As a result, a space-charge region 15 is created that advances and extends horizontally across epitaxial region 11 from the base regions (12,14) in the direction of the collector region 13. At some point, a critical electric field is established at the perimeter of $P^+$ base region 14, and breakdown is initiated. Eventually, the effective collector/base junction of the BJT becomes forward biased so that a snapback condition occurs, resulting, equivalently, in the formation of a Zener diode between the base and collector regions. The Zener diode then presents a low-impedance path for the ESD current. In this manner, the ESD current and voltage are diverted from the IC and conducted to GND by the Zener diode.

In the operation of an ESD protection device such as described above, the triggering voltage at which breakdown initially occurs is of appreciable importance. Because the triggering voltage, or ESD threshold, is generally coincident with the creation of the critical electric field between the base and the collector regions, the triggering voltage is controlled by, e.g., is generally inversely related to, the spacing dimension. From one perspective, controllability of ESD triggering in this fashion is a salutary feature of an ESD device such as ESD protection device 10. However, because the spacing dimension is dependent on the relationship between at least two masking steps, it is especially susceptible to fabrication process tolerances and variations. Therefore, the design of the ESD protection device must accommodate such variations in a manner that assures reliability in the face of ESD events. Inevitably, the accommodation of such generous tolerances results in a design that occupies more than the minimal amount of semiconductor real estate. Furthermore, the inherent variations alluded to above impede the transportability of the fabrication process from one manufacturing facility to another.

Accordingly, what is desired is an ESD protection technique that tends to minimize variations in the ESD triggering point so that tighter tolerances may be maintained in a given fabrication process and so that a fabrication process may be transported in tact from one manufacturing facility to another. Tighter tolerances in the ESD triggering point are significant also for the degree in which conservation of semiconductor area is thereby achieved.

BRIEF DESCRIPTION OF THE DRAWINGS

The subject Self-Aligned Integrated ESD Device may be better understood by, and its many features, advantages and capabilities made apparent to, those skilled in the art with reference to the Drawings that are briefly described immediately below and attached hereto, in the several Figures of which identical reference numerals (if any) refer to identical or similar elements and wherein.

Figure 1:
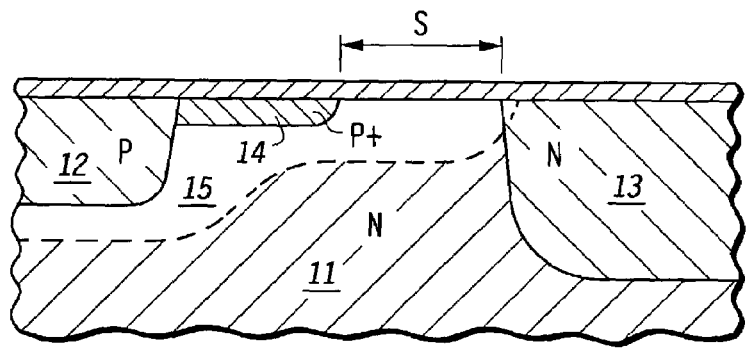
FIG. 1 is a cross-sectional view of a conventional ESD protection device in which a P-type base region (12) and an N-type collector (13) are formed in an N-type epitaxial layer (11), whereby horizontal breakdown is effected between a P+ base extension (14) and the N-type collector.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENT(S)

For a thorough understanding of the subject Self-Aligned Integrated ESD Device, reference is made to the following Detailed Description, which includes the appended Claims, in conjunction with the above-described Drawings.

In a manner that will be made eminently clear below, the subject invention subsists, in one form, in an ESD protection device that responds to an ESD event by the initiation of vertical breakdown between the base and the collector of an integral NPN transistor. Breakdown eventually causes the collector/base junction to become forward biased so that a snapback condition occurs, resulting, equivalently, in the formation of a Zener doiode between the collector and base regions. The transistor comprises an N-type epitaxial collector in which there is formed a first (deep, lightly doped) P-type base region. A second (shallow, highly doped) P+ base region is formed on the epitaxial layer as a hole or window in the first base region, so as to be at least partially surrounded or circumscribed by the first base region. Because the spacing of the base region, that is, the width of the P+ window, controls breakdown of the transistor, and because that spacing is defined by the design of a single mask step, variations in the ESD triggering point tend to be minimized. The result is an ESD protection device that efficiently utilizes semiconductor device area and that enables processes used in the fabrication of the device to be transported between manufacturing facilities with continuity.

Figure 2:
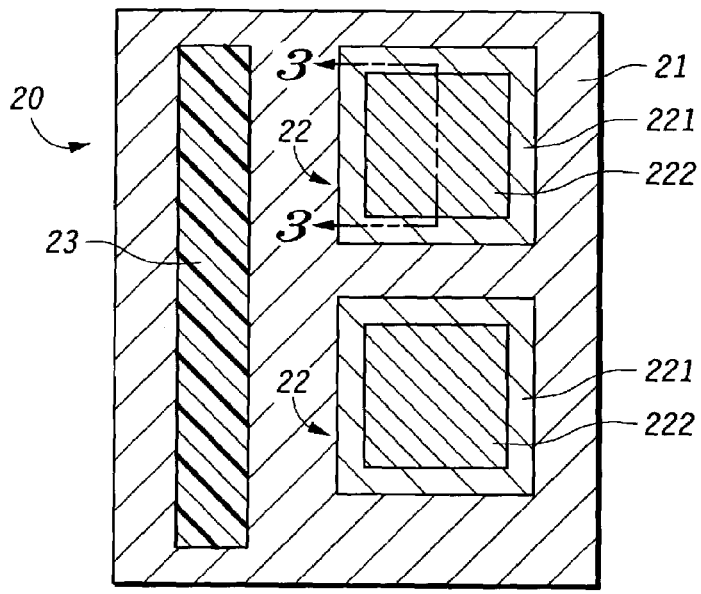
FIG. 2 is a top view of an ESD protection device 20 comprising a plurality of base structures (22), in which a lightly doped, deep base region 221 entirely circumscribes a highly doped, shallow base region 222 in accordance with an embodiment of the invention.

Referring now to FIG. 2, depicted therein is a top view of an ESD protection device 20. As seen there, ESD protection device 20 comprises an NPN transistor having a collector 21, a plurality of base structures 22, and an emitter 23. As is known in the art, the ESD transistor may be provided with a plurality of base structures (two or more, in one embodiment) in order to enhance the power-handling capacity of device 20. Specifically, ESD protection device 20 comprises an N-type epitaxial collector 21 in which there are formed a plurality of P-type base structures 22. Each base structure 22 in turn comprises a first, lightly doped (P−), base region 221 and a second, highly doped (P+), base region 222. One may appropriately consider base region 222 to be constructed in the manner of a hole, or a window, that is formed in base region 221, inasmuch as, at least in the embodiment of FIG. 2, region 221 surrounds or circumscribes region 222.

In one embodiment, P− base region 221 is provided with a dopant concentration of $2 \times 10^{16}$ atoms/cm$^3$; whereas P+ base region 222 is doped to a concentration of approximately $4 \times 10^{17}$ atoms/cm$^3$. Accordingly, highly doped region 222 is doped approximately 200× more heavily than lightly doped region 221. As is well known, areas of P-type conductivity may be established through implantation with boron or antimony. In addition, base region 221 is formed to a depth of approximately 2.2 micrometers (μm) beneath an insulating layer 25 that is formed over ESD protection device 20. (Layer 25, better seen in FIG. 3, may be either deposited or thermally grown SiO$_2$, for example.) Base region 222 is formed to a depth of approximately 1.3 μm.

Figure 3:
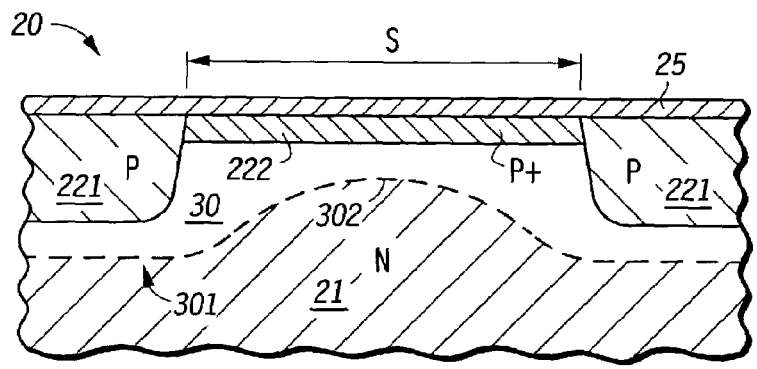
FIG. 3 is a horizontal cross-section of the ESD protection device of FIG. 2 taken along line 3—3, depicting an N-type collector (21), a lightly doped, deep base region (221), highly doped, shallow base region (222), an oxide layer (25) and a space-charge region (30) that arises in response to an ESD event.

A discussion of the operation of ESD protection device 20 may be more conveniently had with respect to FIG. 3, which is a cross-sectional view taken at the plane indicated by the arrowed line 3—3 in FIG. 2. In a manner that will be explained below, operation of ESD protection device 20 is in large part determined by the dimension indicated by the literal "S" in FIG. 3, which may be here referred to as the base spacing. That is, S is the lateral distance between two opposing sides of the generally annular P− base region 221 that surrounds P+ base region 222. More directly, S is the width of P+ base region 222.

As will be made clear below, the base spacing S is a principal determinant of the triggering threshold of ESD protection device 20. Stated alternatively, base spacing S in a sense controls the manner in which vertical breakdown, in response to the occurrence of an ESD event, is initiated between the base regions (221, 222) of a given base structure 22 and collector region 21 of the NPN transistor.

As to operation of ESD protection device 20, first assume that the occurrence of an ESD event is accompanied by the appearance of a positive-going transient voltage and/or current that is coupled to collector region 21. As a practical matter, an ESD event, in the form of a transient voltage and/or current, is coupled to collector region 21 as a result of electrostatic discharge from any one of a myriad of potential sources. The transient, which initially appears at an external pin on the package of an IC product that incorporates ESD protection device 20, is conducted along a path that likely includes various conductive elements, including the IC package pin, bonding pads, conductive traces, etc. As the collector bias increases, a space-charge region 30, indicated by the dashed line 301, arises between the collector and base areas of the ESD protection transistor. In a relatively short period of time, the space-charge region advances from the base regions 221 and 222 toward the epitaxial collector region 21. Space-charge region 30 may be seen in FIG. 3 to extend in a horizontal direction beneath base region 221 and base region 222 and to extend in a vertical direction from the base regions (221, 222) to the collector region 21. At some point, a critical electric field is attained at the edge of the base regions, and breakdown is initiated. Subsequent to the incipience of breakdown, a forward bias is established between the collector and base regions. The forward bias results, equivalently, in the formation of a Zener diode between the collector and base regions. As the bias increases, the effective collector/base Zener diode is driven into the snapback mode of operation.

The snapback phenomenon results primarily from the generation of avalanche current and is perceived as a condition in which the ESD protection device initially presents a high impedance to the ESD source. However, soon after the occurrence of the ESD event, the ESD protection device is driven into a low-impedance mode in which the transistor becomes highly conductive and operates both to divert ESD current and to clamp the ESD transient voltage to a level that is nondestructive of internal semiconductor devices.

With respect to the above, it is to be noted that the base spacing, S, affects ESD triggering in the following manner. If the base spacing, S, is relatively wide, say 5 μm, then the predominant breakdown mechanism arises between the highly doped, shallow base region 222 and collector region 21. Conversely, if the base spacing is relatively narrow, say 1 um, then the predominant breakdown mechanism arises between the lightly doped, deep base region 221 and collector region 21. As a result, a relatively wide base spacing establishes a relatively low trigger voltage; a relatively narrow base spacing establishes a relatively high trigger voltage.

In this regard, FIG. 3 may be understood to depict an ESD protection device structure in which the base spacing dimension, S, has a value nearer to the wide limit of the typical design range. Notice that under this circumstance (relatively wide S), the space-charge region 30, indicated by dashed line 301, becomes most narrow at a point 302 near the highly doped base region 222. As a result, breakdown initially commences predominantly here.

Figure 4:
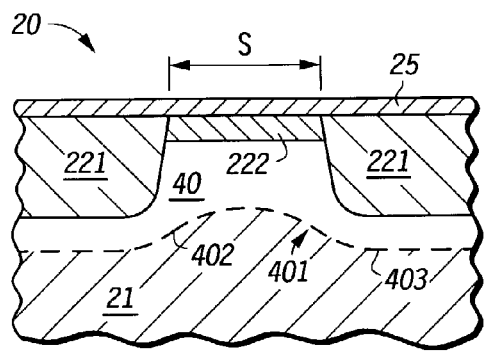
FIG. 4 is a horizontal cross-section of the subject ESD protection device substantially similar in form to the device of FIG. 3, but differing in that the base spacing, S, which is defined by highly doped region 222, is less than the base spacing depicted in FIG. 3.

With attention now directed to FIG. 4, it is seen that the relatively narrow base spacing produces a detectably different collector/base junction profile. In this instance, space-charge region 40, indicated by dashed line 401, most nearly infringes on P-type material at points 402 and 403, near the respectively opposing sides of base region 221. As a result, a narrower base spacing causes breakdown to commence predominantly at the lightly doped, deep base region.

Figure 5:
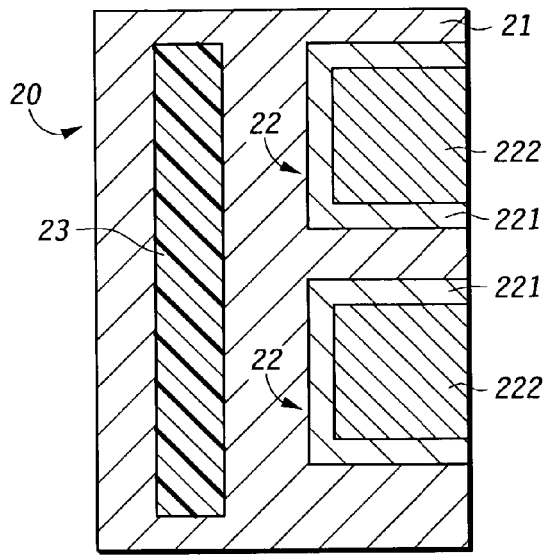
FIG. 5 is a top view of an alternative embodiment in the form of ESD protection device 50, in which the lightly doped base region 521 only partially circumscribes highly doped base region 522.

FIG. 5 represents an alternative to embodiment, in the form of ESD protection device 50. By way of comparison, note that in the construction in FIG. 2, the lightly doped, deep base region 221 entirely circumscribes, or surrounds, highly doped, shallow base region 221. In the approach of FIG. 2, in which the P⁻ area entirely wraps the P⁺ region, there is minimal opportunity for surface charging or surface potential modification to occur. However, the ESD protection device area can become large. In the alternative embodiment of FIG. 5, base region 521 only partially surrounds base region 522, so that the amount of semiconductor area occupied by device 50 is reduced. Although nearly all the advantages of the structure of FIG. 2 inhere in the configuration of FIG. 5, be aware that the implementation of FIG. 5 results in a base structure 52 in which one side of highly doped region 522, rather than being bounded by lightly doped region 521, forms a junction with the N-type collector 21. In this configuration, a component of current will flow in the horizontal direction between base region 522 and the adjoining collector area. (In FIG. 2, the corresponding current flow is restricted to the vertical direction, toward the underlying collector area.) The horizontal current flows transversely, and in proximity, to $SiO_2$ layer 25, at the interface between silicon regions (21,522) and $SiO_2$ layer 25. Current flow near $SiO_2$ layer 25 may result in the injection of electrons (for example) into layer 25, causing permanent degradation in device characteristics. Specifically, under these conditions, layer 25 is known to be susceptible to surface charging or surface potential modification. Furthermore, each ESD event tends to inflict some degree of damage, in the form of surface charging or surface potential modification, to the $Si/SiO_2$ interface. Symptomatic of the damage, the ESD threshold tends to migrate incrementally outward subsequent to each ESD event. The tendency toward higher ESD thresholds is facially undesirable because conduction of the ESD protection device must comfortably preempt unintended conduction by the active devices that are sought to be protected. Therefore, it is desirable that the ESD threshold remain at a safely low point so that conduction by the ESD protection device is assured to anticipate destructive or damaging conduction by active devices. Accretion in the ESD threshold therefore may tend to compromise the protection that is afforded.

Figure 6:
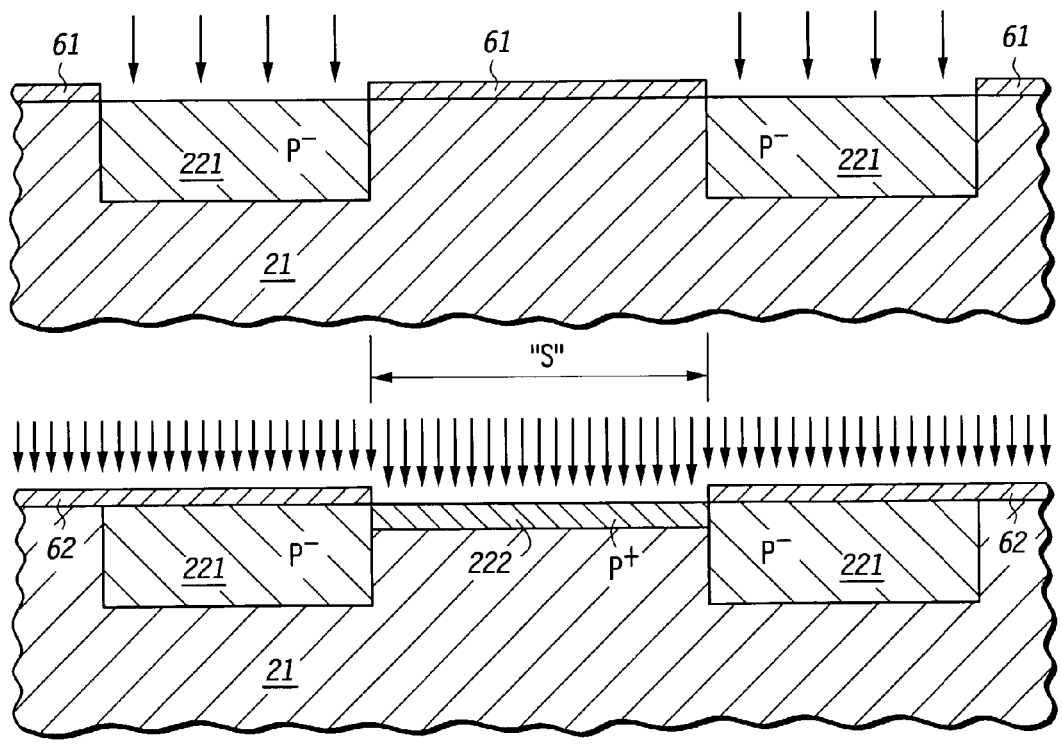
FIG. 6 represents process steps (masking and implantation) that illustrate the manner in which a self-aligned, highly doped, shallow base region 222 is formed so as to have a predetermined lateral dimension. A single masking layer (62) defines the width of base region 222.

FIG. 6 presents, in an abridged form, process steps encountered in one embodiment of a fabrication process for ESD protection device 20. A layer of photoresist 61 is patterned on the surface of N-type epitaxial layer 21. Exposed areas of layer 21 are the implanted to form the lightly doped, deep base region 221. As indicated above, in one embodiment, base region 221 may be implanted to have a net concentration of $2 \times 10^{16}$ atoms/cm³ and a depth of approximately 2.2 μm. In a step subsequent to the implantation of base region 221, a layer of photoresist 62 is patterned to cover areas of base region 221 so as to leave exposed a central area (window or hole) having the lateral dimension S. The exposed area is then implanted to have, in one embodiment, a net concentration of $4 \times 10^{17}$ atoms/cm³ and a depth of approximately 1.3 μm. One readily perceives from the above that the base spacing S is independent of the geometry or implantation of base region 221 and is, for practical purposes, solely determined by the masking layer that is imposed for the implantation of region 222.

Because the base spacing is a factor that controls the point and manner of ESD triggering, the ability to define the base spacing with a single masking step is an advantage of significance. As a direct result, tolerances that are imposed on the ESD triggering point may be tightened appreciably. The ability to satisfy tighter tolerances in the ESD triggering point becomes increasingly important as the operating voltages of active IC devices are lowered in design in order to, inter alia, conserve semiconductor real estate and to achieve low-power operation. Consider that the fundamental nature of the ESD protection device is to exist passively on the IC device, until an ESD event occurs. At that time the ESD device must become conductive, in order to divert ESD energy before the conduction threshold of the active devices. Consequently, as operating voltages decrease, ESD triggering thresholds decrease, and acceptable (absolute) ESD tolerances must decrease accordingly. Failure to realize tolerances that track lower operating voltages necessitates a degree of design latitude that consumes a larger area of silicon, thereby conflicting with the objective of semiconductor real estate conservation. For example, in one application of the subject invention, data suggests that the improvement in ESD triggering tolerances enabled by the subject invention corresponds to a 5% conservation in semiconductor area.

Figure 7:
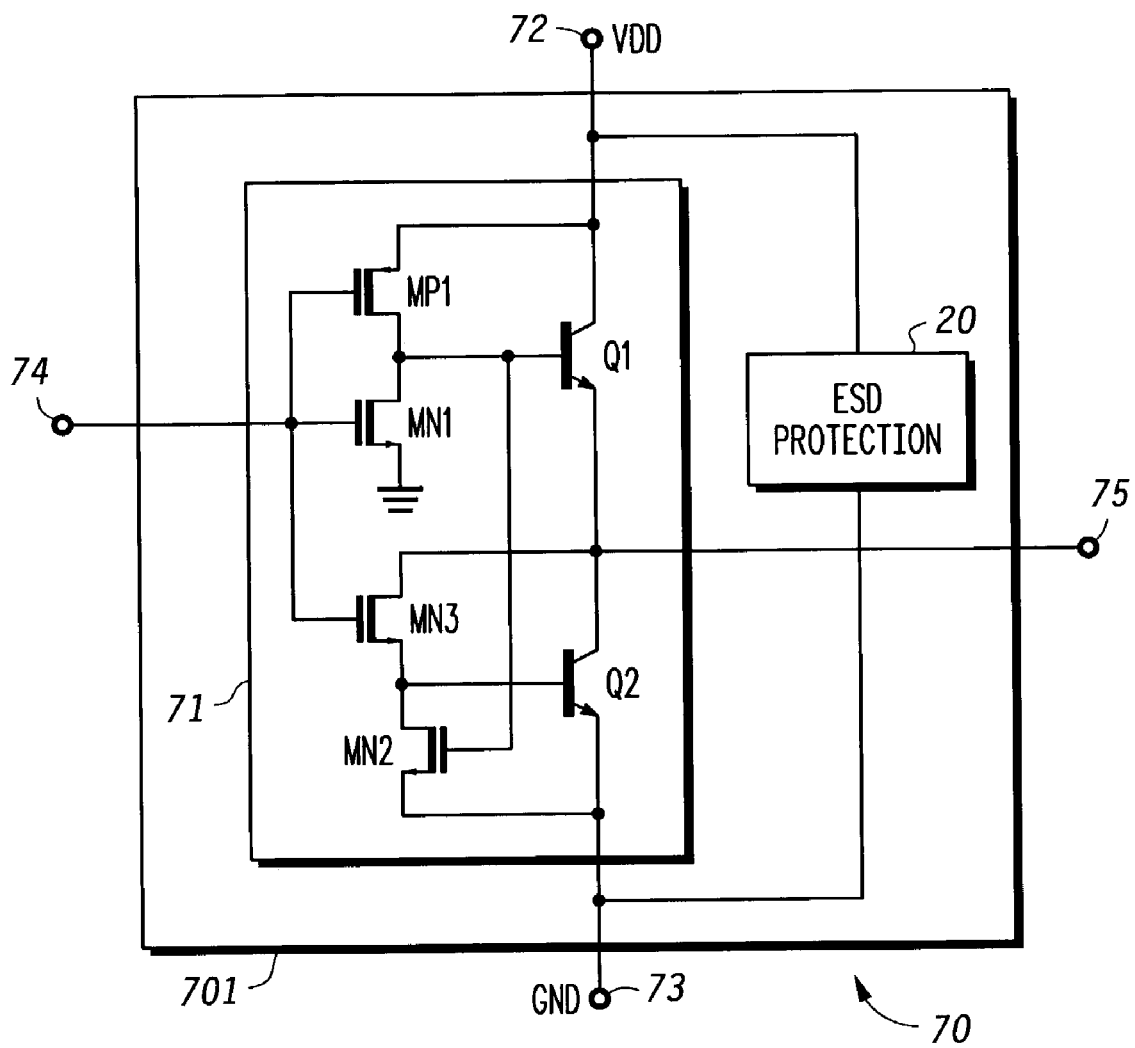
FIG. 7 is a partial block diagram/circuit schematic of an integrated circuit product (70) that incorporates an ESD protection device (20) in accordance with the invention.

Consider now FIG. 7, in which there is depicted a block diagram/circuit schematic of an IC product 70 that incorporates an ESD protection device 20 in accordance with the subject invention. As is commonplace, IC product 70 may include any number of functional semiconductor devices. A BiCMOS inverter 71 is illustrated in FIG. 7, but inverter 71 is intended here to be illustrative of the numerous types of devices that may be implicated, including, but not limited to, microprocessors, memories, digital signal processors, linear amplifiers, communications processors, etc. In general, the semiconductor devices of IC product 70 will be enclosed in a package 701 of plastic, metallic, ceramic or other appropriate material, depending on the application. As illustrated in FIG. 7, devices internal to package 701 are electrically connected to external sources of signals through a number of metallic pins, such as pins 72, 73, 74 and 75. The aforementioned pins in FIG. 7 are shown to connect devices in IC product 70 to a voltage supply $V_{DD}$, to GND, to an input, and to an output, respectively. In the embodiment of FIG. 7, ESD protection device 20 is coupled between pin 72 ($V_{DD}$) and pin 73 (GND). In this manner, ESD protection device 20 is operative to protect active circuitry, as exemplified by BiCMOS inverter 71, from ESD events that may appear at pin 72. As indicated above, ESD events may arise in the form of voltage transients that result from charge transfer to IC pins as a result of human contact, machine handling, operation in hostile environments, and the like.

FIG. 7 suggests an embodiment in which ESD protection device 20 is deployed in proximity to one of the pins of IC product 70. This form of localized ESD protection connotes the provision of a dedicated ESD protection device locally at one or more pins where an ESD event is either most likely to occur or where internal devices are most vulnerable. For example, ESD protection devices are likely to be applied at pins where supply voltages are coupled to IC product 70, where there is a substantial likelihood of external contact (such as in the course of production, maintenance or troubleshooting activities), and at pins that present high impedances. In particularly severe environments or applications, localized ESD protection may be provided at every pin. Alternatively, ESD protection may be deployed in a distributed arrangement. Such might be the case, for example, with respect to IC products that utilize pairs (usually) of conductive rails for power distribution, whereby voltage-carrying and current-carrying conductors are routed around the perimeter of the active area of the IC, generally resembling a transmission line. In this context, ESD protection devices may be judiciously distributed along, and between, the power rails in a manner that effects distributed ESD protection.

From the above Description, it is beyond peradventure that the subject Integrated Self-Aligned ESD Device, in its numerous embodiments, is notable in the many features, advantages and capabilities that it affords. To wit: the ESD triggering voltage is controllable by a single parameter, the base spacing, (width of the highly doped region) that is inserted in each base structure. The manner in which the ESD threshold is determined, that is, by the dimensions of a shallow, highly doped hole (or window) in a deep, lightly doped base region of a bipolar transistor, which dimensions are in turn realized in a single masking step, promotes compliance with more ambitious tolerances in the ESD triggering threshold. The more tightly controlled tolerence translates directly into a conservation of semiconductor area because less area is consumed by the ESD protection device. Furthermore, the tight tolerances may be preserved as fabrication of IC products is transported from one manufacturing facility to another. In addition, in at least one embodiment (FIG. 2), the avoidance of exposed Si/SiO$_2$ interfaces tends to minimize damage that results from leakage currents.

In the Description above, the invention has been set forth in the context of specific embodiments, in a manner that is intended to be illustrative and is intended to convey a thorough comprehension of the invention. However, one of ordinary skill in the art pertaining to the design and fabrication of semiconductor devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and dimensions identified herein. Similarly, those skilled in the art understand that conductivity types (P-type, N-type) may, in general, be reversed, provided that requisite consistency is preserved. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitations(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited Elements but also other elements not explicitly recited or enumerated but inherent to such process, method, article, or apparatus.

I claim:

1. A method of fabricating an ESD protection device, the method comprising:
   providing collector layer of a first conductivity type;
   forming a first base region in the collector layer, the first base region having a second conductivity type;
   forming a second base region in the first base region, the second base region having the second conductivity type;

wherein the first base region and the second base region are formed so that the first base region has a depth that is greater than a depth of the second base region and so that the second base region is more highly doped than the first base region;
and wherein the second base region is formed by:
patterning, with a single mask layer, photoresist on the first base region so as to leave exposed a central area having a predetermined lateral dimension; and
implanting the central area to form the second base region that has a depth less than the depth of the first base region and has a dopant concentration greater than a dopant concentration of the first base region.

2. A method of fabricating an ESD protection device as defined in claim 1, wherein the first conductivity type is N-type and the second conductivity type is P-type.

3. A method of fabricating an ESD protection device as defined in claim 1, wherein the first base area and the second base area are formed so that the first base area only partially surrounds the second base area.

4. A method of fabricating an ESD protection device as defined in claim 1, wherein the patterning establishes a predetermined lateral dimension that is effective to cause an ESD response in which vertical breakdown between the collector region and the first base region predominates with respect to vertical breakdown between the collector region and the second base region.

5. A method of fabricating an ESD protection device as defined in claim 1, wherein the patterning establishes a predetermined lateral dimension that is effective to cause an ESD response in which vertical breakdown between the collector region and the second base region predominates with respect to vertical breakdown between the collector region and the first base region.

6. A method of fabricating an ESD protection device as defined in claim 1 further comprising:
placing the ESD protection device in an integrated circuit;
providing a conductive pin for coupling the integrated circuit to external signals;
coupling an active semiconductor device coupled to the conductive pin; and
coupling the ESD protection device to the conductive pin.

7. A method of fabricating an ESD protection device comprising:
providing a first base area, the first base area having a first conductivity type and having a first dopant concentration;
providing a second base area formed within the first base area, the second base area having the first conductivity type, having a second dopant concentration, wherein the second base area is formed by:
patterning, with a single mask layer, photoresist on the first base area so as to leave exposed a central area having a predetermined lateral dimension; and
implanting the central area to form the second base area that has a depth less than the depth of the first base area and has a dopant concentration greater than a dopant concentration of the first base area; and
providing a collector area of a second conductivity type and positioned beneath the first and the second base areas.

8. A method of fabricating an ESD protection device as defined in claim 7, further comprising:
coupling an ESD event to the ESD protection device; and
effecting vertical breakdown between the collector area and one or both of the first and the second base areas in response to the ESD event.

9. A method of fabricating an ESD protection device as defined in claim 8, further comprising:
controlling occurrence of the vertical breakdown in response to the ESD event by the predetermined lateral dimension of the second base area.

10. A method of fabricating an ESD protection device as defined in claim 8, further comprising:
forming a relatively wide lateral dimension so that vertical breakdown between the second base area and the collector area predominates over vertical breakdown between the first base area and the collector area in response to the ESD event.

11. A method of fabricating an ESD protection device as defined in claim 8, further comprising:
forming a relatively narrow lateral dimension so that vertical breakdown between the first base area and the collector area predominates over vertical breakdown between the second base area and the collector area in response to the ESD event.

12. A method of fabricating an ESD protection device as defined in claim 8, further comprising:
forming an equivalent Zener diode between the collector area and one or both of the first and the second base areas in response to vertical breakdown between the collector area and one or both of the first and the second base areas.

* * * * *